United States Patent [19]
Jones

[11] Patent Number: 5,479,653
[45] Date of Patent: Dec. 26, 1995

[54] DISK ARRAY APPARATUS AND METHOD WHICH SUPPORTS COMPOUND RAID CONFIGURATIONS AND SPARELESS HOT SPARING

[75] Inventor: Craig Jones, Austin, Tex.

[73] Assignee: Dellusa, L.P., Austin, Tex.

[21] Appl. No.: 275,176

[22] Filed: Jul. 14, 1994

[51] Int. Cl.⁶ .................................................. G06F 11/10
[52] U.S. Cl. ............................. 395/182.03; 395/182.05; 395/441; 364/944.61
[58] Field of Search ........................... 395/575, 400, 395/425; 371/10.1, 10.2; 364/943.9, 944.2, 944.61, 944.92, 970

[56] References Cited

U.S. PATENT DOCUMENTS

| | | | |
|---|---|---|---|
| 5,265,098 | 11/1993 | Mattson et al. | 371/11.1 |
| 5,301,297 | 4/1994 | Menon et al. | 395/575 |

*Primary Examiner*—Vincent P. Canney
*Attorney, Agent, or Firm*—Jeff Hood; James Huffman

[57] ABSTRACT

A disk array architecture which supports compound RAID configurations and which can automatically switch between various RAID configurations in case of drive failures to prevent data loss and retain data redundancy. In the preferred embodiment, the disk array system of the present invention begins operation with an array configuration that implements a maximum of data redundancy using all of the available disk drives. As drive failures occur, the disk array system automatically reconfigures one or more of the drives to other RAID configurations which utilize less data redundancy and thus require a lesser number of drives. This automatic reconfiguration occurs until the least amount of redundancy remains, or no redundancy remains. In this manner, the disk array system initially takes advantage of all of the available drives for maximum performance and redundancy while still retaining a high level of fault tolerance. Also, no human intervention is immediately required to replace a failed disk drive because the disk array system automatically reconfigures one or more drives to a different scheme to compensate for the failed drive while still retaining some level of redundancy. As subsequent drive failures occur after a first failure and prior to installation of respective replacement drives, no data will be lost up to a point because the disk array system simply reconfigures one or more of the drives to a different RAID scheme using less redundancy.

42 Claims, 6 Drawing Sheets

DRIVER ARCHITECTURE OF THE PRESENT INVENTION

DISK ARRAY APPARATUS AND METHOD WHICH SUPPORTS COMPOUND RAID CONFIGURATIONS AND SPARELESS HOT SPARING

FIELD OF THE INVENTION

The present invention relates to disk arrays in computer systems, and more particularly to a disk array architecture which supports compound RAID configurations and automatically switches between different RAID configurations as disk failures occur to support "spare-less" hot sparing.

DESCRIPTION OF THE RELATED ART

Modern computer systems require increasingly greater amounts of memory and storage capabilities. This is particularly true in network server applications where a single computer referred to as a file server stores files for a number of users in a local area network (LAN). In a typical file server, the storage needs typically exceed the capacity of current hard disks, and thus most file servers require multiple disks to provide the necessary storage capacity. A typical disk drive storage configuration uses a redundant array of inexpensive disks, referred to as a RAID configuration, whereby the drives are linked together through hardware to form a drive array. In this manner, a number of individual hard disks are combined to create a massive virtual system. The drives in the array are coordinated with each other and information is allocated between them.

In a typical RAID configuration data is split between the drives at the bit, byte or block level. For example, in a four drive system-two bits of every byte might come from the first hard disk, the next two bits from the second hard disk, and so on. The four drives then output a single byte data stream four times faster than a serial drive implementation, i.e., transferring all the information comprised in a byte takes only as long as required for a single drive to transfer two bits. This technique of splitting data between several drives is referred to as data striping. Operating multiple individual disks together as an array allows for higher speeds, improved reliability, and greater resistance to errors than can be achieved by operating each disk independently.

One possible drawback to data striping is that the failure of any drive in the system results in the complete failure of the entire system. Therefore, various methods have been developed to use a portion of the capacity of the drive array to yield more reliable and fault-tolerant storage systems. This increased reliability and fault-tolerance is achieved through various redundancy measures, including mirroring and parity implementations. Currently, five levels of RAID technology are now recognized. Each of these implementations has various tradeoffs regarding efficient use of drive capacity, fewest number of drives, greatest reliability, and best performance. RAID 1 is the simplest drive array implementation and simply comprises two equal capacity disks or sets of disks that mirror each other. One disk duplicates all the files of the other, essentially serving as a backup copy. RAID 2 interleaves bits or bytes of data, i.e., implements data striping as explained above, and uses one or more redundant disks to correct single bit errors and detect double bit errors. The number of extra disks required depends upon the particular error correction algorithm used. RAID 3 implements byte-level data striping and includes one additional drive for parity checking. RAID 4 interleaves sectors of data, not bits or bytes. In addition, the sectors are read serially as if the drives in the array were functionally one large drive with more heads and platters. One drive in the array is dedicated to parity checking for reliability. The RAID 4 implementation offers the advantage that operating systems can process multiple data requests simultaneously and further can receive and reorganize requests to perform them in the most efficient manner. In the RAID 5 implementation, the disk array does not include a single dedicated parity drive as in RAID 4, but rather the parity check function is rotated throughout the various drives in the array. In this manner, error checking is distributed across all of the disks in the array. RAID 4 can be considered a degenerate form of RAID 5, i.e., once disk array controller logic has been developed to implement a RAID 5 array, a RAID 4 array can be implemented by simply disabling the logic which distributes parity across the disks in the array. In addition to the five levels of RAID technology discussed above, the term "RAID 0" is often used to refer to a number of disk drives that are data striped but have no form of redundancy.

RAID disk subsystems are used in environments where performance and data availability is critical. Data redundancy is used to provide high data availability and prevent one disk failure from incapacitating the entire array. When a drive failure occurs in a drive array using a RAID configuration, there is typically sufficient redundancy remaining to reconstruct the lost data. In many drive array systems, an intelligent controller will reconstruct the lost data as necessary until a replacement drive is installed. In other words, during the time between the failure of a drive and its replacement with a new drive, the data on the failed drive is automatically generated using the other drives and the redundancy drive, and thus the drive array behaves as if the drive failure has not occurred. When the replacement drive is installed, the "lost" data is reconstructed onto the replacement drive using the data from the remaining drives and the redundancy data. If a second drive failure were to occur after the first drive failure and prior to installation of a replacement drive, then in most configurations data would be irretrievably lost. Therefore, data redundancy relies on the assumption that one or more failed disk drives are replaced and the lost data is reconstructed on the replacement drive as quickly as possible.

In order to avoid the possibility of irretrievably losing data,, many RAID subsystems include the ability to attach online spare disk drives that can be used as automatic replacements for failed drives. The use of such spare drives minimizes the possibility of data loss because a failed drive can be automatically replaced with the spare drive. However, many users are unwilling to pay the cost of an online spare drive for each disk subsystem, primarily because the spare will be used very infrequently, i.e., only during drive failures.

One alternative to online spare drives is referred to as hot pluggable drives. According to this scheme, an online spare drive is not included within the disk array system. When a disk failure occurs, a new drive is purchased and used to replace the failed drive, and the lost data is automatically recreated on the new drive by the disk array controller using the redundancy data. One problem with this method is that the failure of a drive requires manual intervention to replace the failed drive with a new drive. In addition, this method requires that one or more spare drives be kept in a nearby location or be immediately available to replace failed drives. Because manual intervention is required, in some instances the failed drive may not be replaced for a lengthy period of time, and thus there is a possibility of a second failed drive, resulting in irretrievable data loss as described above.

Therefore, a method and apparatus for a disk array architecture is desired which can automatically compensate for failed drives without requiring one or more dedicated spare drives. A disk array architecture is further desired which requires a minimum of human intervention to account for failed drives and which also has a high resistance to data loss.

SUMMARY OF THE INVENTION

The present invention comprises a disk array architecture which supports compound RAID configurations and which can automatically switch between various RAID configurations in case of drive failures to prevent data loss and retain data redundancy. In the preferred embodiment, the disk array system of the present invention begins operation with an array configuration that implements a maximum of data redundancy using all of the available disk drives. As drive failures occur, the disk array system automatically reconfigures one or more of the drives to other RAID configurations which utilize less data redundancy and thus require a lesser number of drives. This automatic reconfiguration occurs until the least amount of redundancy remains, or no redundancy remains. In this manner, the disk array system initially takes advantage of all of the available drives for the maximum performance and redundancy, thus maintaining a high level of fault tolerance. No human intervention is immediately required to replace a failed disk drive because the disk array system of the present invention automatically reconfigures one or more drives to a different scheme to compensate for the failed drive while still retaining some level of redundancy. As subsequent drive failures occur after a first failure and prior to installation of respective replacement drives, no data will be lost up to a point because the disk array system simply reconfigures one or more of the drives to a different RAID scheme using less redundancy.

In the preferred embodiment of the invention, the disk array system of the present invention includes eight disk drives which are initially configured as a full RAID 1 array. In this configuration, four drives are used for data storage, and each drive includes a corresponding mirror drive which maintains an exact copy of data on the corresponding data drive. The user thus benefits from the superior performance and redundancy characteristics of the RAID 1 organization. When a disk drive fails and no on-line spare is available, the remaining drive in the respective mirrored pair where the failure occurred preferably combines with an adjacent pair to form a three drive set, which is then reconfigured as a RAID 4 set. As additional drives fail, the data sets are rearranged accordingly until the resulting disk array configuration becomes strictly a RAID 4 configuration. Therefore, prior to a disk failure, the disk array system of the present invention implements a full RAID 1 array which includes the equivalent of one or more spare drives and hot spare functionality without the additional cost associated with spare drives. As disk drives fail, the disk array system of the present invention simply reconfigures one or more of the remaining drives according to a RAID 4 configuration, thus requiring less disk drives but still maintaining some level of redundancy. The disk array system of the present invention preferably can reconfigure to a pure RAID 4, and if a subsequent failure occurs, the drive array system preferably handles the failure as would a standard RAID 4 disk array configuration.

Thus, the disk array controller and architecture of the present invention automatically compensates for one or more lost drives by beginning operation in a state of maximum redundancy and reconfiguring one or more of the drives according to different RAID configurations which use less redundancy as disk failures occur. The disk array controller of the present invention also converts back to more redundant RAID configurations, and ultimately to a full RAID 1 configuration, as the respective failed drives are replaced.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
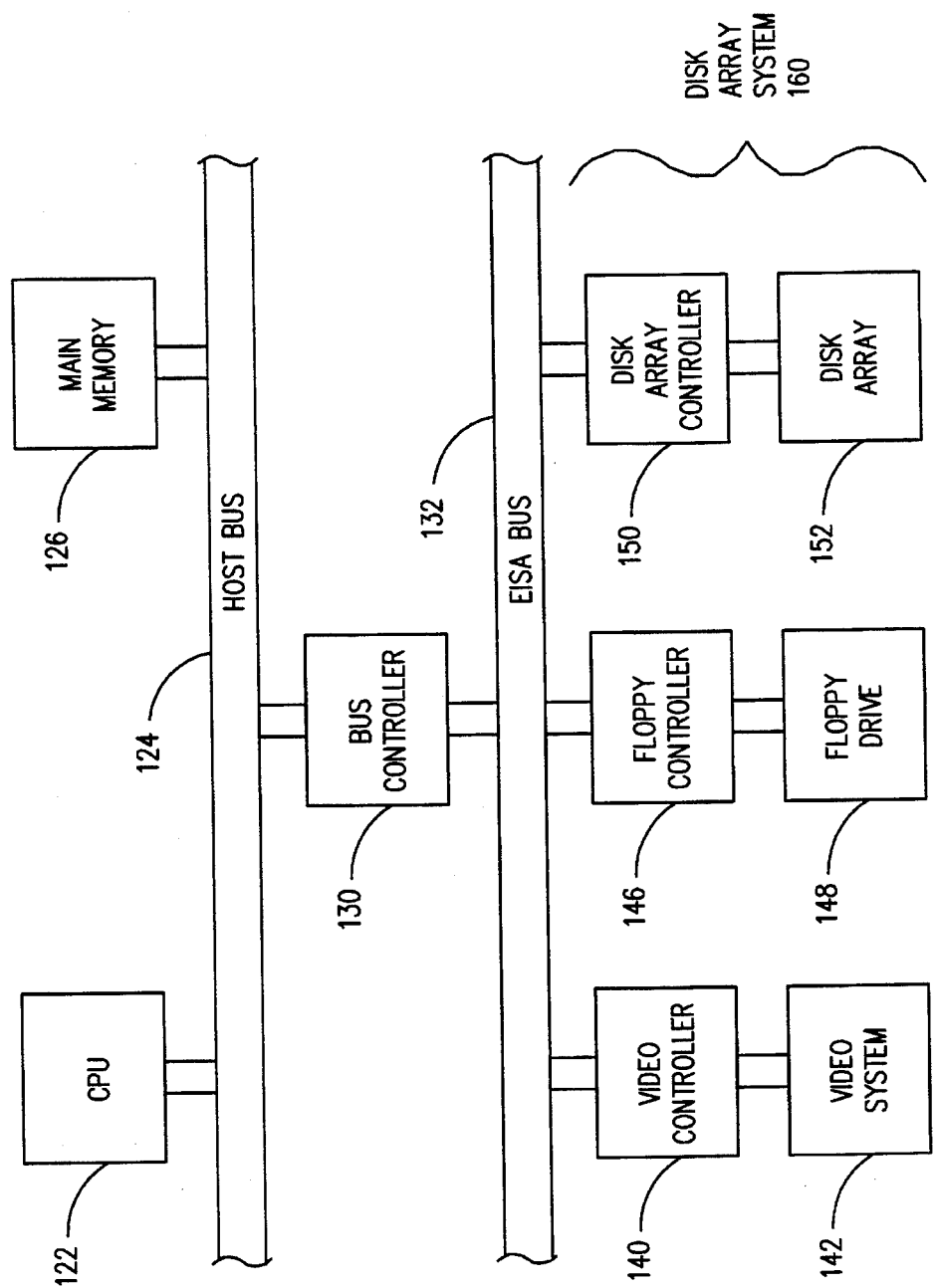
FIG. 1 is a block diagram of a computer System incorporating a disk array system of the present invention.

Referring now to FIG. 1, a computer system including a disk array system according to the preferred embodiment of the invention is shown. The elements of a computer system that are not important to the operation of the present invention have been omitted for simplicity. The computer system includes a CPU (central processing unit) 122 coupled to a host or memory bus 124. Main memory 126 is also coupled to the host bus 124. A bus controller 130 is coupled between the host bus 124 and an input/output (I/O) or expansion bus 132. In the preferred embodiment, the expansion bus 132 is preferably the extended industry standard architecture (EISA) bus 132, although various other types of expansion bus may be used. Also, the bus controller 130 is preferably the Intel 82358 EISA bus controller (EBC).

Coupled to the expansion bus 132 are a video controller 140 and video system 142, as well as a floppy controller 146 and floppy drive 148. A disk array system 160 according to the preferred embodiment of the present invention is coupled to the expansion bus 132. The disk array system 160 comprises a disk array controller 150 and disk array 152. The disk array controller 150 is coupled to the expansion bus 132, and a plurality of disk drives comprising the disk array 152 are coupled to the disk array controller 150. The disk drives 152 preferably utilize the SCSI (small computer systems interface) bus standard for interconnection of the various disk drives. However, it is noted that other peripheral device interface standards may be utilized, as desired.

Figure 2:
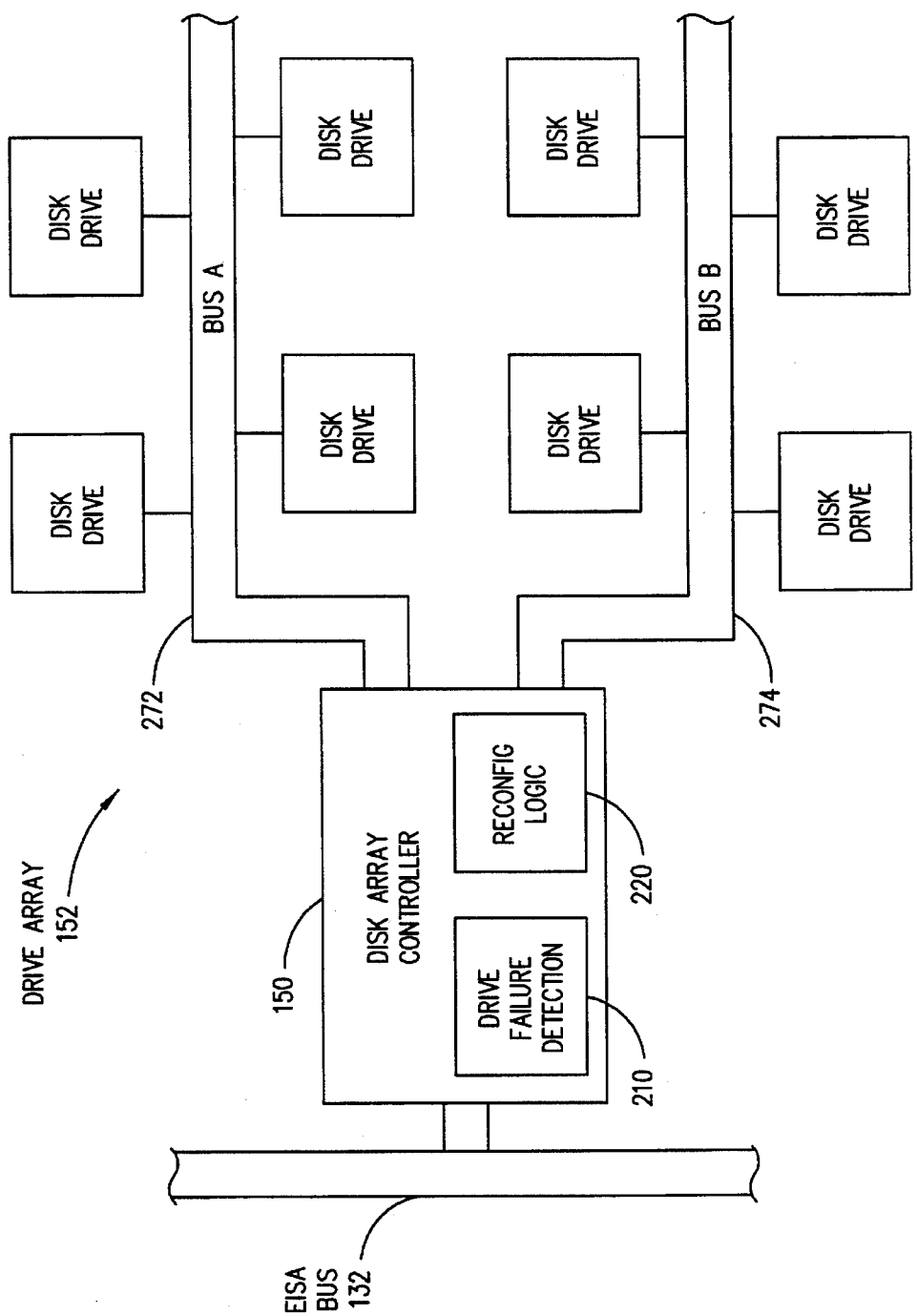
FIG. 2 illustrates the disk array system shown in FIG. 1.

Referring now to FIG. 2, the disk array controller 150 and disk drives comprising the disk array 152 are shown. The disk array controller 150 preferably includes logic to control operations on two buses 272 and 274 preferably SCSI buses as discussed above. In the preferred embodiment, four disk drives 152 are connected to each of the SCSI buses 272 and 274. It is noted that up to seven disk drives may be connected to each bus 272 and 274 for a 14 drive configuration. Also, in an alternate embodiment, one or more additional controllers may be attached to the respective SCSI buses 272 and 274, each of which may connect up to seven additional SCSI devices 152. Thus the present invention is capable of operating with any of a various number of disk drives, as desired. As shown, the disk array controller 150 includes disk drive failure detection logic 210 for detecting failures among disk drives. The disk array controller 150 further includes reconfiguration logic 220 coupled to the disk drive failure detection logic 210 which reconfigures one or more drives in the disk array 152 to different RAID configurations as disk failures occur.

Figure 3:
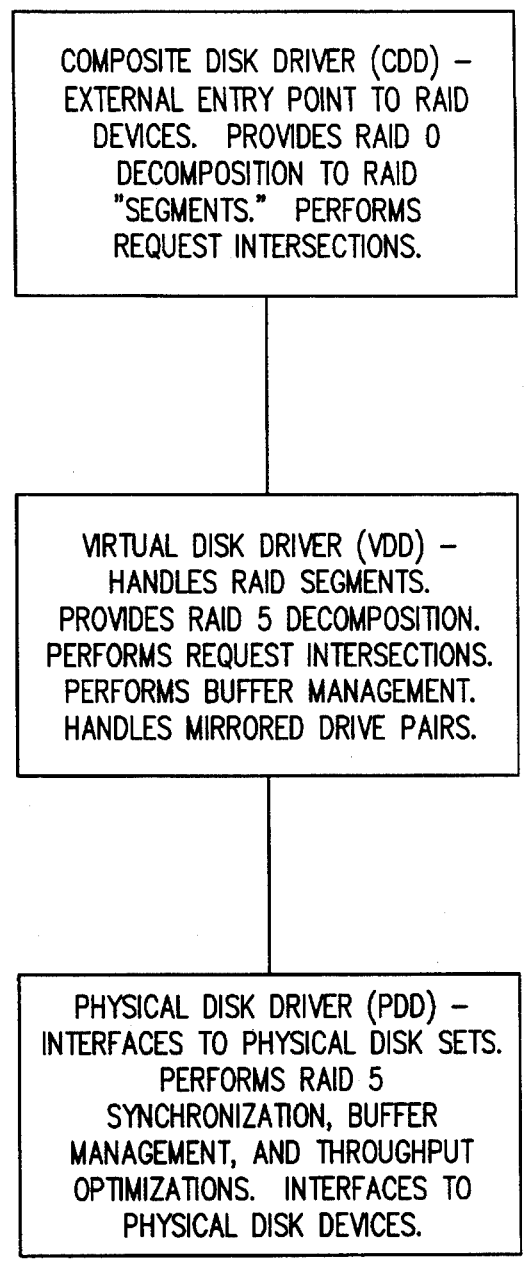
FIG. 3 illustrates the internal driver architecture of the disk array controller of FIG. 2.

Referring now to FIG. 3, the internal driver architecture in the disk array controller 150 of the present invention is shown. As shown, the disk array controller 150 includes three levels of drivers referred to as the composite disk driver, the virtual disk driver, and the physical disk driver. The composite disk driver operates as the external entry point to the RAID devices, i.e., the disk drives. Driver software operating on the host such as the CPU 22 provides a request to the disk array controller 150, and this request is initially examined by the composite disk driver. The composite disk driver provides RAID 0 decomposition to RAID segments, i.e., the composite disk driver parses the host data request into a number of specific requests for segments in the disk drive array 152 according to a RAID 0 configuration. In other words, the composite disk driver parses the host data request into a number of specific requests for each of the drive sets as if the drive sets were configured in a standard RAID 0 configuration.

Figure 5A:
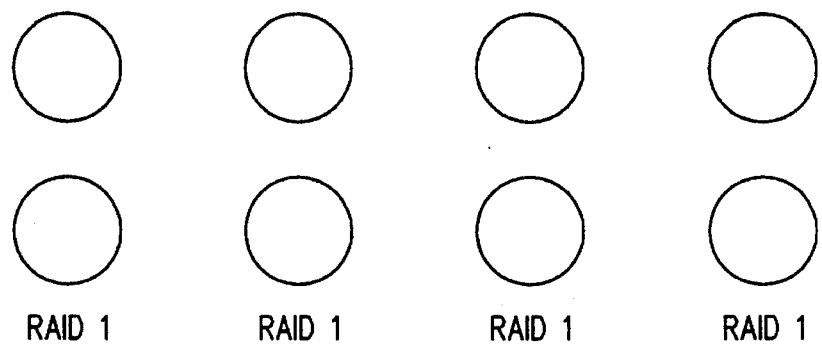
FIG. 5 consisting of 5A through 5E illustrates the various configurations of a disk array having eight drives as drive failures occur.

The composite disk driver utilizes information provided by the reconfiguration logic 220 to allocate request blocks to each of the logic drives. For example, if the disk drives are configured as simple mirrored pairs as shown in FIG. 5A, the composite disk driver parses the host request into a plurality of different request blocks that map to each of the respective mirrored pairs. However, if the disk drives are configured as in either of FIGS. 5B or 5C wherein one or more drive sets are configured as RAID 1 mirrored pairs, with the other drives configured as a RAID 4 configuration, the composite disk driver distributes a block of data to each of the respective one or more mirrored pairs and distributes two or more blocks of data to the RAID 4 configuration. Thus the composite disk driver views a mirrored pair as one RAID 0 disk drive, and a RAID 4 disk drive set as being two or more RAID 0 drives for the purposes of data distribution. The composite disk driver also handles request intersections, i.e., if overlapping write requests to the same drive destination have been received, the composite disk driver ensures that these requests are performed in the order received.

The virtual disk driver also utilizes information from the reconfiguration logic 220 to determine the current configuration of the disk drives. The virtual disk driver receives the requests for the RAID segments and the disk array configuration information and performs RAID 4/5 decomposition as necessary. RAID 4/5 decomposition involves processing the various input and output requests and performing data striping to stripe the data across each of the logical drives. If a RAID 5 implementation is being used, the virtual disk driver also performs the necessary operations to distribute parity across each of the logical drives. This includes a reordering layer that operates to distribute parity across each of the drives. If a RAID 4 implementation is being used, then this reordering layer is disabled and no distributed parity operations occur. In the preferred embodiment, the virtual disk drive also performs various buffer management features which include allocating local buffers for caching and write posting purposes, as is well known in the art. These local buffers are also preferably used as intermediate storage for read modify write operations. Further request intersection operations may also be performed here, as desired. In addition, the virtual disk driver preferably handles mirrored drive pairs.

The physical disk driver directly interfaces with the physical disk sets and operates to transfer data to and from the physical disks, as is well known in the art. The physical disk driver also preferably performs RAID 4/5 synchronization, buffer management and throughput optimizations, as desired. However, since these operations are not necessary for an understanding of the operation of the present invention, details of these features are omitted for simplicity. The primary purpose of the physical disk driver is to interface to the physical disk devices, i.e., perform the necessary functions to physically access each of the disk drives.

Figure 4:
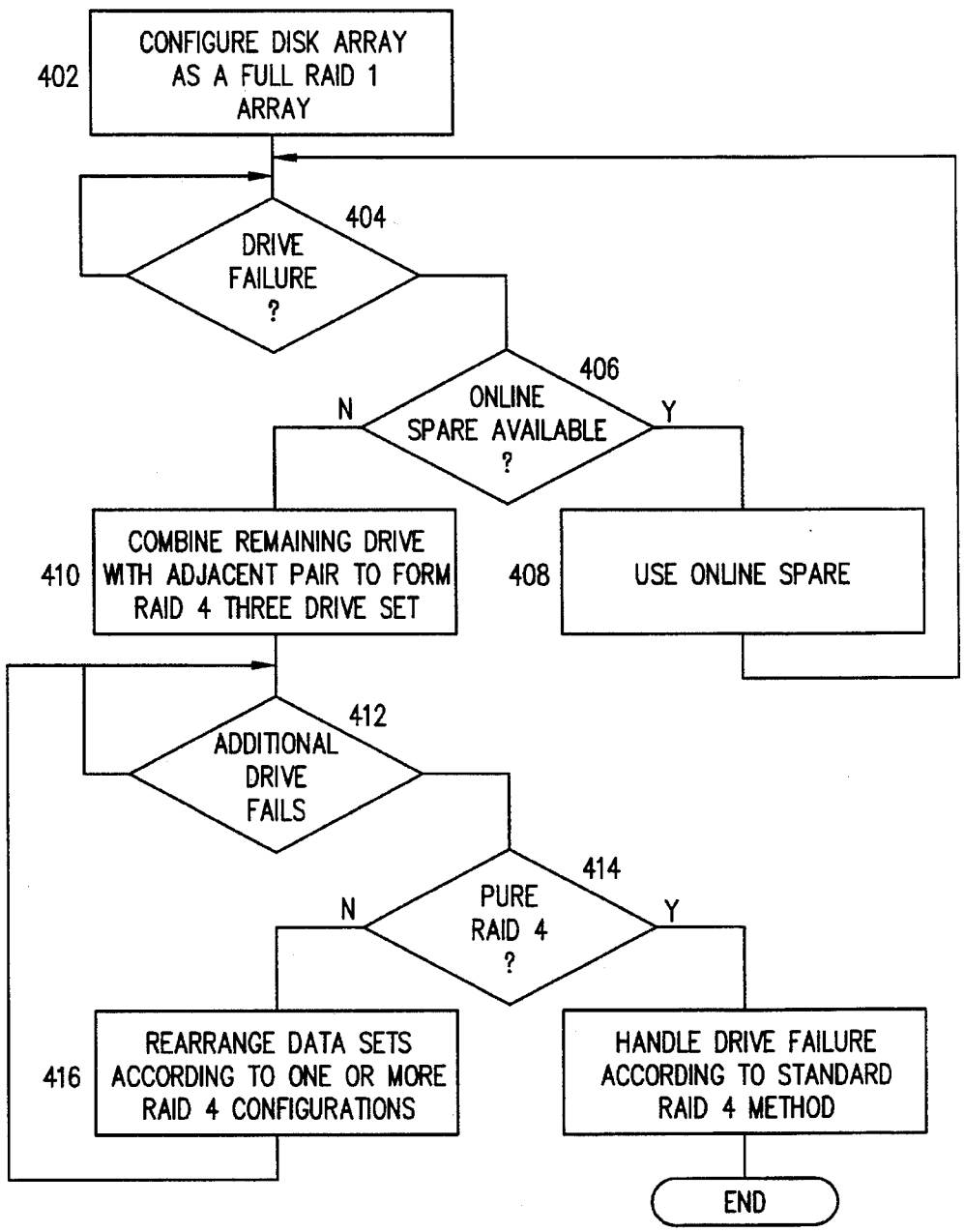
FIG. 4 is a flowchart diagram illustrating operation of the disk array controller as disk drive failures occur.

Referring now to FIG. 4, a flowchart diagram illustrating operation of the disk array controller 150 according to the preferred embodiment of the present invention is shown. In step 402 the disk array system 160 preferably begins operation wherein the drive array 152 is configured as a full RAID 1 array. This RAID 1 array is illustrated in FIG. 5A, wherein the 8 disk drives are configured as four mirrored pairs of drives, as shown. The disk array system 160 remains in a full RAID 1 array as long as no drive failure occurs. Thus the disk array system 160 benefits from the improved performance and redundancy of a RAID 1 array until a disk failure occurs.

Figure 5B:
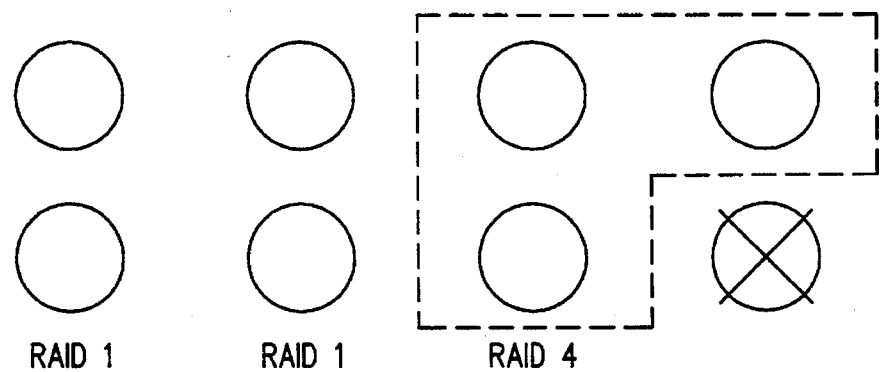

If a drive failure is determined to occur in step 404, then in step 406 the disk array controller 150 determines if an on-line spare is available. If an on-line spare is available, then the disk array system uses the on-line spare in step 408 to replace the failed drive, and operation returns to step 404. Thus if an on-line spare is used, the disk array 152 remains in a pure RAID 1 configuration. If no on-line spare is determined to be available in step 406, then in step 410 the disk array controller 150 preferably combines the remaining drive from the pair where the failure occurred with an adjacent pair to perform a RAID 4 three drive set, as illustrated in FIG. 5B. The disk array system remains in this split RAID 1/4 configuration until an additional drive fails. During this time, the disk array 152 is configured with three logical drives, these being the two mirrored RAID 1 pairs and the one RAID 4 pair. The composite driver operates to distribute the data such that one block is provided to each of the RAID 1 mirrored pairs and two blocks are provided to the RAID 4 drive set. Also, the virtual disk driver operating in the disk controller 150 performs the data striping functions necessary to distribute the data among the RAID 4 configuration. It is also noted that the remaining drive from the pair where the failure occurred can be combined with the adjacent pair to perform a RAID 5 three drive set if desired. If a RAID 5 implementation is used instead of a RAID 4, then the virtual disk driver also performs parity distribution operations to distribute parity among each of the three drives in the three drive RAID 5 set. It is further noted that other configurations may be implemented, such as combining the remaining drive with two other pairs to form a five drive RAID 4 or RAID 5 set, as desired.

Figure 5C:
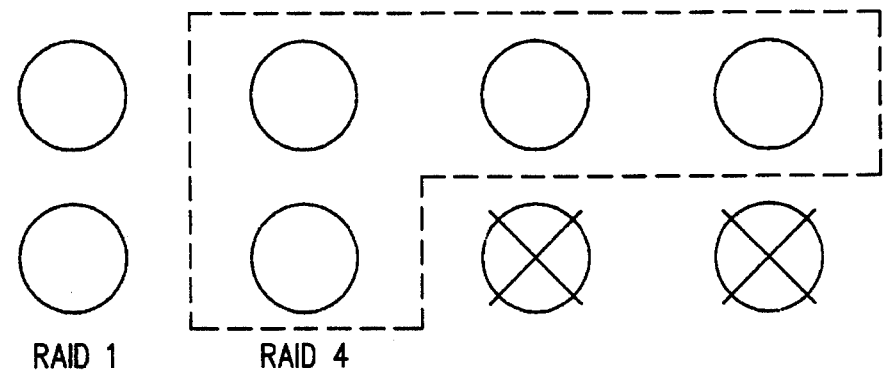
Figure 5D:
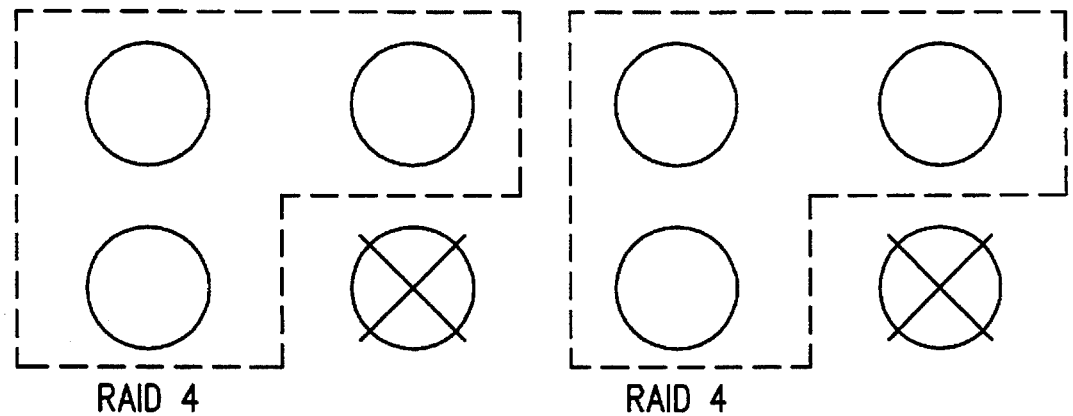

If an additional drive is determined to fail in step 412, then in step 414 the disk controller 150 determines if it has entered a pure RAID 4 configuration. If not, then in step 416 the disk array controller 150 rearranges the data sets in the disk array 152 according to one or more RAID 4 configurations. In this instance, the disk array controller 150 has several choices as to how to reconfigure the disk drives, as shown in FIGS. 5C and 5D. As shown in FIG. 5C, if the second disk failure was a disk that was part of the three drive RAID 4 set shown in FIG. 5B, then the three drive RAID 4 set shown in FIG. 5B is preferably extended to form an additional mirrored pair to incorporate a four drive RAID 4 configuration as shown in FIG. 5C. Alternatively, the remaining two drives in the three drive set can incorporate a drive from one of the two remaining mirrored pairs, and the three remaining drives can be configured as a second three drive RAID 4 set as shown in FIG. 5D. If the second disk drive failure is a disk that was part of either of the two mirrored pairs shown in FIG. 5B, then the remaining three drives from these two mirrored pairs are preferably recombined into a three drive RAID 4 set. This results in the drive array 152 comprising two three drive RAID 4 sets as shown in FIG. 5D. Alternatively, the remaining good drive from that mirrored pair can be combined with the three drive RAID 4 set already created to form a four drive RAID 4 set with one mirrored pair remaining, as shown in FIG. 5C. If the disk drive array is already in either of the states shown in FIGS. 5C and 5D, and an additional drive fails in step 412, then the remaining disk drives are preferably arranged according to a pure five disk RAID 4 configuration, as shown in FIG. 5E.

Figure 5E:
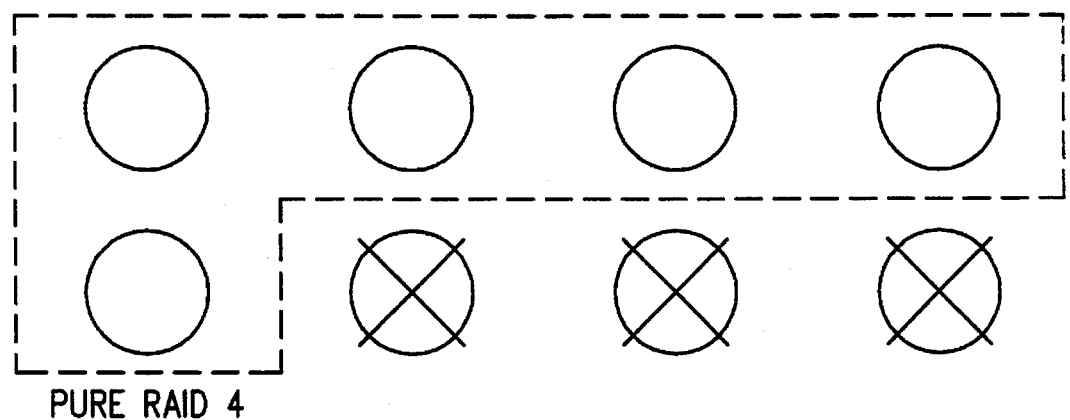

If an additional drive fails in step 412, and the disk array 152 is determined in step 414 to already be in a pure RAID 4 configuration as shown in FIG. 5E, then the drive failure is handled according to a standard RAID 4 method. According to this method, if the drive that failed was the dedicated parity drive, then the parity data on that drive is simply ignored, and the four remaining drives in the RAID 4 configuration operate as before. If the drive failure is one of the four data drives in the five disk RAID 4 configuration, then the disk controller 150 operates to reconstruct the lost data from the three remaining good drives and the parity drive as necessary until a replacement drive is inserted.

Thus it is noted that the disk array system 160 of the present invention can reconfigure itself to various configurations as drive failures occur. Although the preferred embodiment contemplates reconfiguring drives according to a RAID 4 configuration in steps 410 and 416, in alternate embodiments the drives are configured according to other schemes, such as RAID 5. It is also noted that the disk array 152 can be reconfigured regardless of where the physical drives are located in the array. Thus, when drives are reconfigured to either a three drive or four drive RAID 4 configuration as shown in FIGS. 5B and 5C respectively, the drives comprising the three or four drive RAID 4 set can be located on different SCSI buses as necessary. It is further noted that the present invention can be adapted to disk array systems with a lesser or greater number of drives comprised in the drive array 152. For example, in a sixteen drive disk drive array, the reconfiguration is similar for each of the two eight drive sets, but of course, various other combinations of RAID 1 and RAID 4/5 configurations are possible, as would be obvious to one of ordinary skill in the art. Likewise, any disk drive configuration can be supported in the disk array system 160 of the present invention.

Thus the disk array system of the present invention supports compound RAID configurations and provides "spareless" hot sparing. The disk drive array 152 is initially configured where all of the drives are used for maximum performance and redundancy. As drive failures occur, the disk drive array 152 is automatically reconfigured to compensate for the failed drive and to correspondingly provide less redundancy. This reconfiguration can take place numerous times until no redundancy remains. Thus, the disk array system 160 operates as if a plurality of spare drives were available, but these "spare" drives are incorporated into a configuration with greater redundancy, i.e., a pure RAID 1 configuration or mixed RAID 1/4 configuration, to provide increased performance and redundancy until drive failures necessitate the drive array 152 be reconfigured into a less redundant configuration. The disk array system of the present invention also requires an absolute minimum of human intervention.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A method for supporting compound configurations in a disk array system comprising a disk array including a plurality of disk drives and a disk array controller coupled to the disk array, the method comprising the steps of:

configuring the disk array according to a first configuration;

the disk array controller determining that a first disk drive failure has occurred, wherein one or more of the drives comprising said drive array remain functioning properly after said disk drive failure; and the disk array controller automatically reconfiguring one or more of the one or more functioning drives comprising said drive array into a second configuration in response to said first disk drive failure being determined to have occurred in said step of determining.

2. The method of claim 1, wherein said first configuration incorporates greater data redundancy than said second configuration.

3. The method of claim 2, wherein said first configuration comprises a RAID 1 configuration.

4. The method of claim 1, wherein said step of reconfiguring comprises reconfiguring one or more of said drives according to a RAID 4 configuration.

5. The method of claim 1, wherein said step of reconfiguring comprises reconfiguring one or more of said drives according to a RAID 5 configuration.

6. The method of claim 1, wherein said first configuration comprises a full RAID 1 configuration and said plurality of drives comprising said array are configured as mirrored pairs, wherein said disk drive failure involves a disk drive in one of said mirrored pairs, wherein said step of reconfiguring comprises combining the remaining disk drive from said mirrored pair where said disk drive failure occurred with another mirrored pair to form a three drive set using said second configuration.

7. The method of claim 1, further comprising:

replacing the first failed disk drive with an operational drive; and the disk array controller automatically reconfiguring said one or more of the drives comprising said drive array from the second configuration to the first configuration using said operational drive after said step of replacing.

8. The method of claim 1, further comprising:

determining if a second disk drive failure has occurred; and reconfiguring one or more of the drives comprising said drive array into a third configuration if a second disk drive failure was determined to have occurred in said step of second disk drive failure determining.

9. The method of claim 8, wherein said third configuration includes less data redundancy than said second configuration.

10. The method of claim 1, further comprising:

determining if said disk array is in a configuration of a third type after said step of determining that a disk drive failure has occurred;

wherein said step of reconfiguring is performed only if said disk array is not in said third type of configuration.

11. The method of claim 10, wherein said third type of configuration comprises a pure RAID 4 configuration.

12. The method of claim 10, wherein said third type of configuration comprises a pure RAID 5 configuration.

13. The method of claim 8, further comprising:

replacing the second failed disk drive with an operational drive; and the disk array controller automatically reconfiguring said one or more of the drives comprising said drive array from the third configuration to the second configuration using said operational drive after said step of replacing.

14. The method of claim 8, further comprising:

replacing the first and second failed disk drives with operational drives; and the disk array controller automatically reconfiguring said one or more of the drives comprising said drive away from the third configuration to the first configuration using said operational drives after said step of replacing.

15. A disk drive array system which supports compound configurations, comprising:

a disk drive array having a first configuration; and a disk drive array controller coupled to said disk array, comprising:

disk drive failure detection logic which detects when a drive failure occurs; and reconfiguration logic coupled to said disk drive failure logic and said disk drive array which reconfigures one or more disk drives in said disk drive array according to a second configuration if said disk drive failure detection logic detects a drive failure;

wherein said reconfiguration logic reconfigures one or more disk drives in said disk drive array each time after said disk drive failure detection logic detects a drive failure for a plurality of times.

16. The disk drive array system of claim 15, wherein said first configuration includes greater data redundancy than said second configuration.

17. The disk drive array system of claim 16, wherein said first configuration comprises a RAID 1 configuration.

18. The disk drive array system of claim 15, wherein said reconfiguration logic reconfigures one or more of said drives according to a RAID 4 configuration.

19. The disk drive array system of claim 15, wherein said reconfiguration logic reconfigures one or more of said drives according to a RAID 5 configuration.

20. The disk drive array system of claim 15, wherein said reconfiguration logic reconfigures one or more disk drives in said disk drive array to a configuration having less redundancy each time after said disk drive failure detection logic detects a drive failure for a plurality of times.

21. The disk drive array system of claim 15, wherein said reconfiguration logic reconfigures said one or more disk drives in said disk drive array from the second configuration to the first configuration if the failed disk drive is replaced.

22. A method for supporting compound configurations in a disk array system comprising a disk array including a plurality of disk drives and a disk array controller coupled to the disk array, the method comprising the steps of:

configuring the disk array according to a first configuration;

the disk array controller determining if a disk drive failure has occurred, wherein one or more of the drives comprising said drive array remain functioning properly after said disk drive failure; and.

the disk array controller automatically reconfiguring one or more of the one or more functioning drives comprising said drive array into a configuration having less redundancy than said first configuration if a disk drive failure is determined to have occurred in said step of determining; and the disk controller repeatedly performing said steps of determining and reconfiguring for a plurality of disk drive failures.

23. The method of claim 22, wherein said step of reconfiguring reconfigures one or more of the drives comprising said drive array into a configuration having less redundancy than the configuration of said one or more drives when said disk drive failure occurred.

24. The method of claim 23, wherein said first configuration comprises a RAID 1 configuration.

25. The method of claim 22, wherein said step of reconfiguring comprises reconfiguring one or more of said drives according to a RAID 4 configuration.

26. The method of claim 22, wherein said step of reconfiguring comprises reconfiguring one or more of said drives according to a RAID 5 configuration.

27. The method of claim 22, wherein said first configuration comprises a full RAID 1 configuration and said plurality of drives comprising said array are configured as mirrored pairs, wherein said disk drive failure involves a disk drive in one of said mirrored pairs, wherein said step of reconfiguring comprises combining the remaining disk drive from said mirrored pair where said disk drive failure occurred with another mirrored pair to form a three drive set using said less redundant configuration.

28. The method of claim 22, further comprising:

replacing a failed disk drive with an operational drive; and the disk array controller automatically reconfiguring said one or more of the drives comprising said drive array from a less redundant configuration to a more redundant configuration using said operational drive after said step of replacing.

29. The method of claim 22, further comprising:

determining if said disk array is in a configuration of a second type after said step of determining if a disk drive failure has occurred;

wherein said step of reconfiguring is performed only if said disk array is not in said second type of configuration.

30. The method of claim 29, wherein said second type of configuration comprises a pure RAID 4 configuration.

31. The method of claim 29, wherein said second type of configuration comprises a pure RAID 5 configuration.

32. A method for supporting compound configurations in a disk array system comprising a disk array including a plurality of disk drives and a disk array controller coupled to the disk array, the method comprising the steps of:

configuring the disk array according to a first configuration, wherein said first configuration comprises a full RAID 1 configuration and said plurality of drives comprising said array are configured as mirrored pairs;

determining that a first disk drive failure has occurred, wherein said disk drive failure involves a disk drive in one of said mirrored pairs; and reconfiguring one or more of the drives comprising said drive array into a second configuration in response to said first disk drive failure, wherein said step of reconfiguring comprises combining the remaining disk drive from said mirrored pair where said disk drive failure occurred with another mirrored pair to form a three drive set using said second configuration.

33. The method of line 32, wherein said step of configuring comprises reconfiguring one or more of said drives according to a RAID 4 configuration.

34. The method of line 32, wherein said step of configuring comprises reconfiguring one or more of said drives according to a RAID 5 configuration.

35. The method of claim 32, further comprising:

replacing a failed disk drive with an operational drive; and the disk array controller automatically reconfiguring said one or more of the drives comprising said drive array from a less redundant configuration to a more redundant configuration using said operational drive after said step of replacing.

36. A method for supporting compound configurations in a disk array system comprising a disk array including a plurality of disk drives and a disk array controller coupled to the disk array, the method comprising the steps of:

configuring the disk array according to a first configuration;

determining if a first disk drive failure has occurred;

reconfiguring one or more of the drives comprising said drive array into a second configuration if a first disk drive failure is determined to have occurred in said step of determining;

determining if a second disk drive failure has occurred; and reconfiguring one or more of the drives comprising said drive array into a third configuration if a second disk drive failure was determined to have occurred in said step of second disk drive failure determining.

37. The method of claim 31, wherein said second configuration incorporates less data redundancy than said first configuration, wherein said third configuration includes less data redundancy than said second configuration.

38. The method of claim 37, wherein said first configuration comprises a RAID 1 configuration.

39. The method of claim 31, wherein one or more of said steps of reconfiguring comprises reconfiguring one or more of said drives according to a RAID 4 configuration.

40. The method of claim 31, wherein one or more of said steps of reconfiguring comprise reconfiguring one or more of said drives according to a RAID 5 configuration.

41. The method of claim 31, further comprising:

replacing the second failed disk drive with an operational drive; and reconfiguring said one or more of the drives comprising said drive array from the third configuration to the second configuration using said operational drive after said step of replacing.

42. The method of claim 41, further comprising:

replacing the first failed disk drive with an operational drive; and reconfiguring said one or more of the drives comprising said drive array from the second configuration to the first configuration using said operational drive after said step of replacing.

* * * * *